(12) United States Patent
Lee et al.

(10) Patent No.: US 9,006,762 B2
(45) Date of Patent: Apr. 14, 2015

(54) ORGANIC LIGHT-EMITTING DEVICE AND METHOD OF MANUFACTURING THE SAME

(75) Inventors: Chang-Ho Lee, Yongin (KR); Hee-Joo Ko, Yongin (KR); Il-Soo Oh, Yongin (KR); Hyung-Jun Song, Yongin (KR); Se-Jin Cho, Yongin (KR); Jin-Young Yun, Yongin (KR); Bo-Ra Lee, Yongin (KR); Young-Woo Song, Yongin (KR); Jong-Hyuk Lee, Yongin (KR); Sung-Chul Kim, Yongin (KR)

(73) Assignee: Samsung Display Co., Ltd., Yongin, Gyeonggi-Do (KR)

( * ) Notice: Subject to any disclaimer, the term of this patent is extended or adjusted under 35 U.S.C. 154(b) by 89 days.

(21) Appl. No.: 13/200,392

(22) Filed: Sep. 23, 2011

(65) Prior Publication Data

US 2012/0299037 A1  Nov. 29, 2012

(30) Foreign Application Priority Data

May 25, 2011  (KR) .......................... 10-2011-0049793

(51) Int. Cl.
*H01L 33/60* (2010.01)
*H01L 51/52* (2006.01)
*H01L 51/00* (2006.01)

(52) U.S. Cl.
CPC ......... *H01L 51/5206* (2013.01); *H01L 51/0077* (2013.01); *H01L 51/5265* (2013.01)

(58) Field of Classification Search
CPC ............ H01L 51/5206; H01L 51/0077; H01L 51/5265; H01L 51/5088; H01L 51/5092; H01L 51/5234

USPC ........ 257/98, E33.06, 296; 438/29, 149, 592, 438/769; 345/76, 205, 82; 313/506; 428/690

See application file for complete search history.

(56) References Cited

U.S. PATENT DOCUMENTS

| | | | |
|---|---|---|---|
| 6,764,883 B1 * | 7/2004 | Dokumaci et al. | 438/149 |
| 2002/0155319 A1 | 10/2002 | Kawamura et al. | |
| 2004/0070017 A1 * | 4/2004 | Yang et al. | 257/296 |
| 2004/0160172 A1 * | 8/2004 | Tyan et al. | 313/506 |
| 2006/0251920 A1 * | 11/2006 | Aziz et al. | 428/690 |
| 2008/0278067 A1 | 11/2008 | Tyan et al. | |
| 2008/0315763 A1 * | 12/2008 | Dobbertin et al. | 313/512 |
| 2009/0231243 A1 * | 9/2009 | Song | 345/76 |

FOREIGN PATENT DOCUMENTS

| | | |
|---|---|---|
| JP | 2000-243572 A | 9/2000 |
| KR | 10-0702763 B1 | 3/2007 |
| KR | 10-2009-0097464 A | 9/2009 |
| KR | 10-2009-0132356 A | 12/2009 |
| KR | 10-2010-0029757 A | 3/2010 |

* cited by examiner

*Primary Examiner* — Kenneth Parker
*Assistant Examiner* — Bo Fan
(74) *Attorney, Agent, or Firm* — Lee & Morse, P.C.

(57) ABSTRACT

An organic light-emitting device including a substrate, an anode layer on the substrate, the anode layer including $WO_xN_y$ (2.2≤x≤2.6 and 0.22≤y≤0.26), an emission structure layer on the anode layer, and a cathode layer on the emission structure layer.

18 Claims, 7 Drawing Sheets

ORGANIC LIGHT-EMITTING DEVICE AND METHOD OF MANUFACTURING THE SAME

CROSS-REFERENCE TO RELATED PATENT APPLICATION

This application claims the benefit of Korean Patent Application No. 10-2011-0049793, filed on May 25, 2011, in the Korean Intellectual Property Office, the disclosure of which is incorporated herein in its entirety by reference.

BACKGROUND

1. Field of the Invention

Embodiments relate to an organic light-emitting device and a method of manufacturing the same.

2. Description of the Related Art

Organic light-emitting devices are self-light emitting devices that emit light when a voltage is applied thereto, and advantageously have high luminance, large viewing angle, and shorter response time. In addition, they do not require a backlight, and thus, may be manufactured to be thin.

An organic light-emitting device has a structure including an organic emission layer disposed between an anode and a cathode. When a voltage is applied across the electrodes, holes are injected from the anode into a highest occupied molecular orbital (HOMO) of the organic emission layer, while electrons are injected from the cathode into a lowest unoccupied molecular orbital (LUMO) of the organic emission layer. The injected holes and electrons undergo electron exchanges in adjacent molecules in the organic emission layer, thereby migrating to opposite electrodes. An electron-hole pair recombined in a certain molecule forms a molecular exiton in a high-energy excited state. The molecular exitons return a low-energy ground state while emitting light of inherent material color. This is the light emission mechanism of organic light-emitting devices.

In the case of an organic light-emitting device capable of external light emission, the anode and/or the cathode may be manufactured using a transparent material. In particular, to facilitate hole injection, the anode may be manufactured by forming a conductive oxide layer or a metal layer that has a high work function and etching the layer to form an anode pattern. However, in the etching process for anode patterning, particles may be generated and remain on the surface of the anode, thereby causing generation of dark spots. To suppress the generation of dark spots, a thick organic layer may be formed on the anode. However, this may increase a driving voltage level.

SUMMARY

One or more embodiments may provide an organic light-emitting device including: a substrate; an anode layer on the substrate, the anode layer including $WO_xN_y$ ($2.2 \le x \le 2.6$, and $0.22 \le y \le 0.26$); an emission structure layer on the anode layer; and a cathode layer on the emission structure layer.

The anode layer may include an upper region and a lower region, and the upper region may include a larger amount of nitrogen than the lower region. The $WO_xN_y$ ($2.2 \le x \le 2.6$, and $0.22 \le y \le 0.26$) may form the upper region of the anode layer. The upper region of the anode layer may have a thickness of about 50 Å to about 100 Å. The anode layer may have a thickness of about 500 Å to about 1000 Å.

The anode layer may further include a metal selected from silver (Ag), aluminum (Al), molybdenum (Mo), nickel (Ni), cobalt (Co), manganese (Mn), and indium (In).

The emission structure layer may include a hole transport layer, an emission layer, and an electron transport layer sequentially on the anode layer. The emission structure layer may further include a hole injection layer on the anode layer, and an electron injection layer on the electron transport layer.

The emission structure layer may further include a resonance auxiliary layer between the hole transport layer and the emission layer. The emission structure layer may include a red region, a green region, and a blue region, and the anode layer may be common for the red region, the green region, and the blue region. The organic light-emitting device may further include a reflection layer between the substrate and the anode layer.

One or more embodiments may provide a method of manufacturing an organic light-emitting device, the method including: preparing a substrate; forming a $WO_3$ thin layer on the substrate; performing an $N_2$ plasma treatment on the $WO_3$ thin layer to form an anode layer including $WO_xN_y$ ($2.2 \le x \le 2.6$ and $0.22 \le y \le 0.26$); forming an emission structure layer on the anode layer; and forming a cathode layer on the emission structure layer.

The anode layer may include an upper region and a lower region, and the $WO_xN_y$ ($2.2 \le x \le 2.6$, and $0.22 \le y \le 0.26$) may form the upper region of the anode layer.

The upper region of the anode layer may have a thickness of about 50 Å to about 100 Å. The anode layer may have a thickness of about 500 Å to about 1000 Å.

Forming the $WO_3$ thin layer may include further incorporating a metal into the $WO_3$ thin layer, the metal being selected from silver (Ag), aluminum (Al), molybdenum (Mo), nickel (Ni), cobalt (Co), manganese (Mn), and indium (In).

Forming the emission structure layer may include sequentially forming a hole transport layer, an emission layer, and an electron transport layer on the anode layer. Forming the emission structure layer may further include forming a resonance auxiliary layer between the hole transport layer and the emission layer. Forming of the emission structure layer may further include forming a hole injection layer on the anode layer, and forming an electron injection layer on the electron transport layer. The emission structure layer may include a red region, a green region, and a blue region, and the anode layer may be common for the red region, the green region, and the blue region. The method may further include forming a reflection layer between the substrate and the anode layer.

BRIEF DESCRIPTION OF THE DRAWING

The above and other features and advantages of the present invention will become more apparent by describing in detail exemplary embodiments thereof with reference to the attached drawing in which.

DETAILED DESCRIPTION

Figure 1:
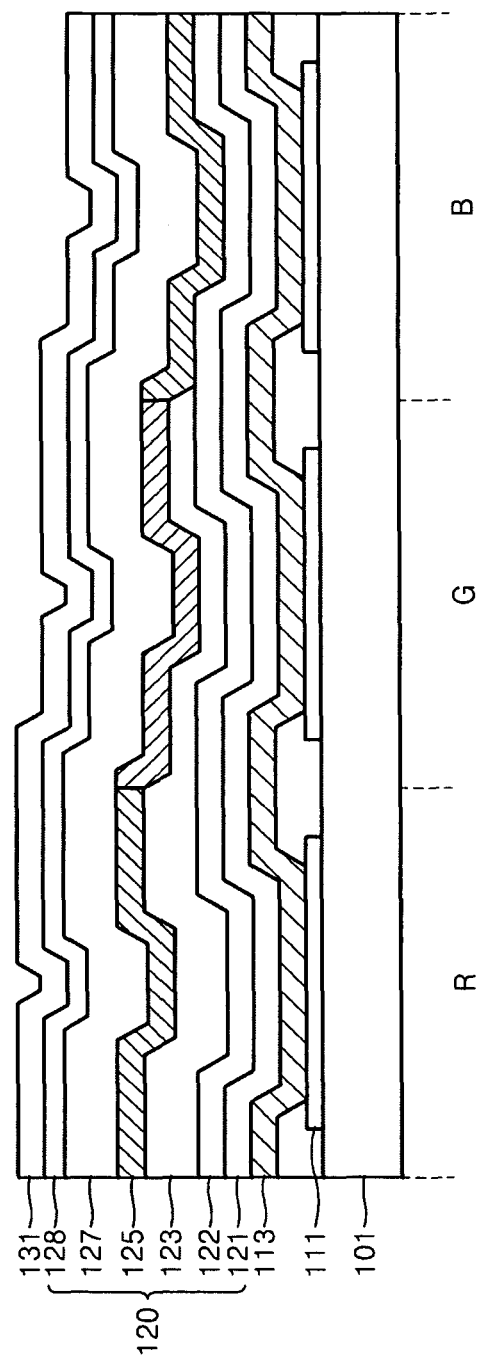
FIG. 1 illustrates a schematic cross-sectional view of an organic light-emitting device according to an embodiment.

Reference will now be made in detail to the exemplary embodiments, examples of which are illustrated in the accompanying drawings. Embodiments may, however, be embodied in many different forms and should not be construed as being limited to the embodiments set forth herein; rather, these embodiments are provided so that this disclosure will be thorough and complete, and will fully convey the concept of embodiments to those skilled in the art. In the drawings, the thicknesses of layers and regions are exaggerated for clarity. Like numbers refer to like elements throughout.

FIG. 1 illustrates a schematic cross-sectional view of an organic light-emitting device according to an embodiment. Referring to FIG. 1, the organic light-emitting device may include red (R), green (G), and blue (B) sub-pixels. In each sub-pixels R, G, and B a reflection layer 111, an anode 113, an organic layer 120, and a cathode 131 may be sequentially formed on a substrate 101. The organic layer 120 may include a hole injection layer 121, a hole transport layer 122, a resonance auxiliary layer 123, an emission layer 125, an electron transport layer 127, and an electron injection layer 128.

Except for the emission layer 125, at least one of the hole injection layer 121, the hole transport layer 122, the resonance auxiliary layer 123, the electron transport layer 127, and the electron injection layer 128 of the organic layer 120 may be omitted. In some embodiments, the organic layer 120 may further include any layer for efficient transfer of electrons and holes. The anode 113, the hole injection layer 121, the hole transport layer 122, the electron transport layer 127, and the electron injection layer 128 may be formed as common layers for the sub-pixels R, G and B. As used herein, a common layer for the sub-pixels R, G, and B refers to a layer formed over the sub-pixels R, G, and B, that is not patterned to separate each sub-pixels R, G, and B. Meanwhile, the reflection layer 111, the resonance auxiliary layer 123, and the emission layer 125 may be formed as separate layers for each of the sub-pixels R, B, and B.

The substrate 101 may be any substrate that is used in existing organic light emitting devices. In some embodiments, the substrate may be a glass substrate or a transparent plastic substrate with strong mechanical strength, thermal stability, transparency, surface smoothness, ease of handling, and water resistance. The substrate 101 may be formed of an opaque material such as silicon, stainless steel, or the like. A switching device, a driving device, or the like consisting of a thin film transistor, may be mounted in the substrate 101.

The reflection layer 111 may be formed of silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), a combination thereof, or an alloy thereof.

The anode 113 may be formed of $WO_3$ the surface of which is treated with $N_2$ plasma. The anode 113 may have a thickness of about 500 Å to about 1000 Å. An upper portion of the anode 113 may be formed of $WO_3N_y$ ($2.2 \leq x \leq 2.6$, and $0.22 \leq y \leq 0.26$) having a thickness of about 50 Å to about 100 Å by $N_2$ plasma treatment. The remaining lower portion of the anode 113 may be formed of $WO_3$ up to the remaining thickness.

Conductive characteristics of the $WO_3$ surface-treated with $N_2$ plasma may be attributed to a change in oxygen content and changes in hole injection characteristics and conductivity of the surface due to the plasma treatment. The N2 plasma-treated $WO_3$ may exhibit improved conductive characteristics even with a thickness of about 1000 Å, allowing formation of the anode 113, with an increased thickness for optical distance adjustment without causing a driving voltage increase.

The $N_2$ plasma-treated $WO_3$ layer may exhibit high conductivity in a vertical direction but low conductivity in a horizontal direction. As such, patterning the anode 113 for each sub-pixel may not be necessary because a voltage transferred through the separate reflection layers 111 may not affect adjacent sub-pixels R, G, and B.

Examples of materials for forming the hole injection layer 121 may include, but are not limited to, phthalocyanine compounds such as copper phthalocyanine, m-MTDATA (4,4',4"-tris(3-methylphenylphenylamino)triphenylamine), TDATA (4,4'4"-tris(N,N-diphenylamino)triphenylamine), 2T-NATA (4,4',4"-tris{N,-(2-naphthyl)-N-phenylamino}-triphenylamine), NPB (N,N'-di(-naphthyl)-N,N'-diphenylbenzidine), PEDOT/PSS (poly(3,4-ethylenedioxythiophene)/poly(4-styrenesulfonate)), Pani/DBSA (polyaniline/dodecylbenzenesulfonic acid), Pani/CSA (polyaniline/camphor sulfonic acid), and PANI/PSS (polyaniline)/poly(4-styrenesulfonate).

The hole injection layer 121 may have a thickness of about 100 Å to about 10000 Å, and in some embodiments, may have a thickness of about 100 Å to about 1000 Å. When the thickness of the hole injection layer 121 is within these ranges, a satisfactory hole injecting ability of the hole injection layer 121 may be obtained without a substantial decrease in a driving voltage.

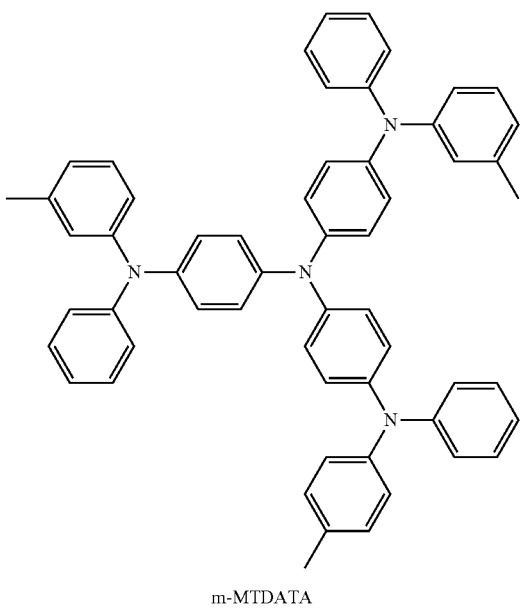

m-MTDATA

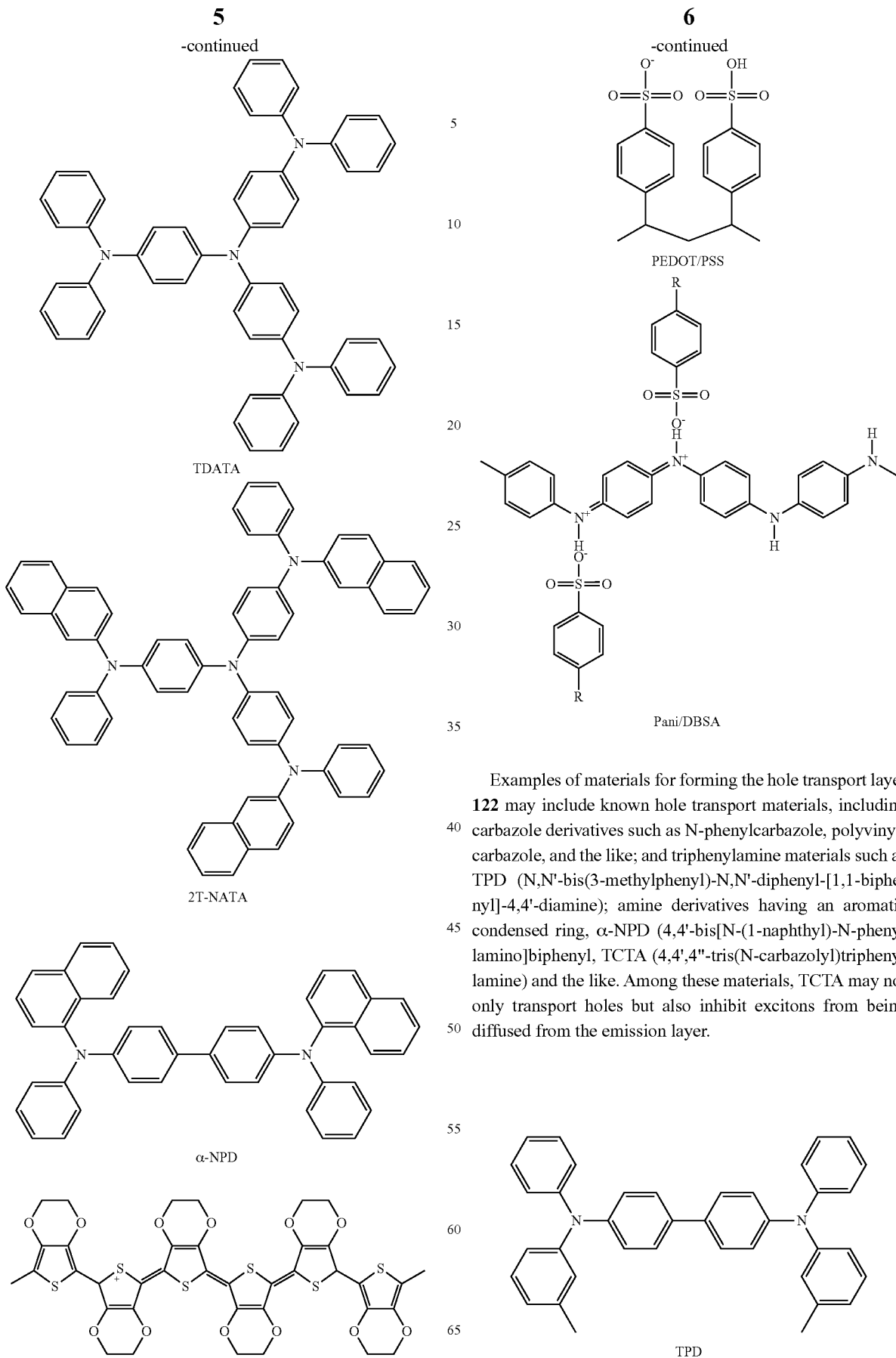

Examples of materials for forming the hole transport layer 122 may include known hole transport materials, including carbazole derivatives such as N-phenylcarbazole, polyvinylcarbazole, and the like; and triphenylamine materials such as TPD (N,N'-bis(3-methylphenyl)-N,N'-diphenyl-[1,1-biphenyl]-4,4'-diamine); amine derivatives having an aromatic condensed ring, α-NPD (4,4'-bis[N-(1-naphthyl)-N-phenylamino]biphenyl, TCTA (4,4',4"-tris(N-carbazolyl)triphenylamine) and the like. Among these materials, TCTA may not only transport holes but also inhibit excitons from being diffused from the emission layer.

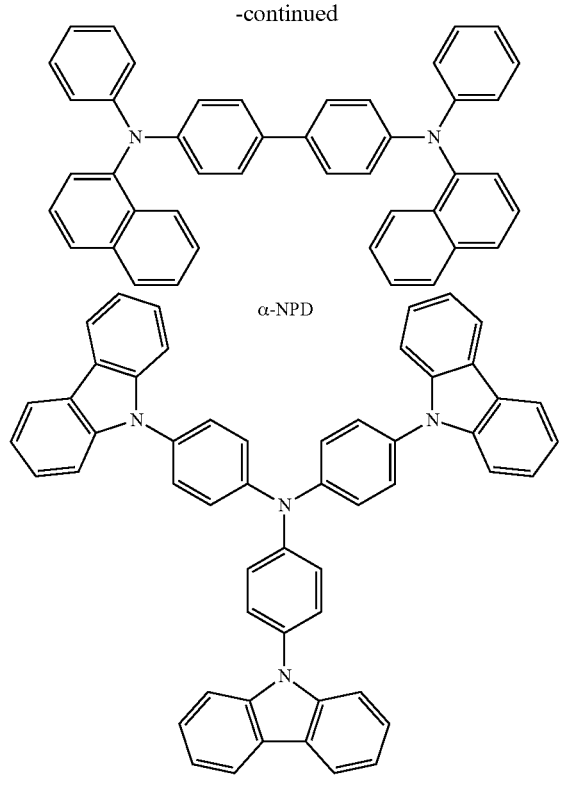

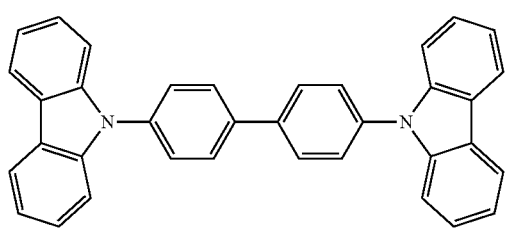

The hole transport layer 122 may have a thickness of about 50 Å to about 1000 Å, and in some embodiments, may have a thickness of about 100 Å to 800 Å. When the thickness of the hole transport layer 122 is within these ranges, the hole transport layer 122 may have a satisfactory hole transporting ability without a substantial drop in a driving voltage.

The resonance auxiliary layer 123 may be formed of a hole transport material, and may have a different thickness for each sub-pixel that is appropriate to induce resonance. For blue sub-pixels, the resonance auxiliary layer 123 may not be formed by adjusting the thickness of the hole transport layer 122.

The emission layer 125 may be formed of a light emitting material, and in some embodiments, may be formed of a combination of a host and a dopant. Examples of known hosts include, but are not limited to, Alq3, CBP (4,4'-N,N'-dicabazole-biphenyl), PVK (poly(n-vinylcarbazole), ADN (9,10-di (naphthalene-2-yl)anthracene), TCTA, TPBI ((1,3,5-tris(N-phenylbenzimidazole-2-yl)benzene), TBADN ((3-tert-butyl-9,10-di(naphth-2-yl) anthracene), E3, and DSA (distyrylarylene).

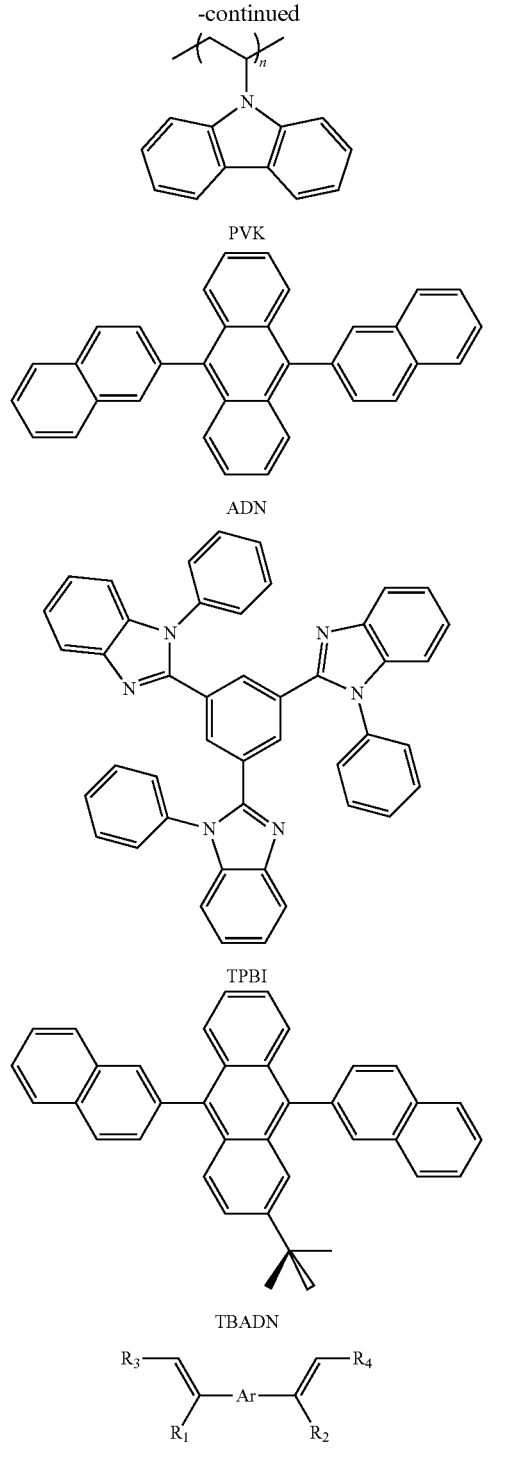

Examples of known red dopants include, but are not limited to, PtOEP, Ir(piq)$_3$, and Btp$_2$Ir(acac).

Examples of known green dopants include, but are not limited thereto, Ir(ppy)3 (ppy=phenylpyridine), Ir(ppy)₂(acac), and Ir(mpyp)₃.

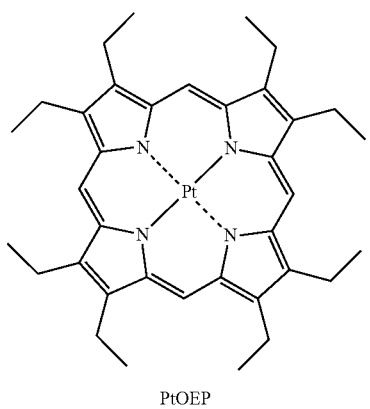

PtOEP

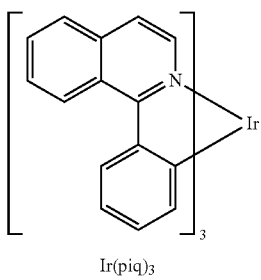

Ir(piq)₃

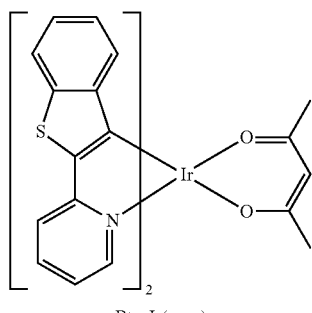

Btp₂Ir(acac)

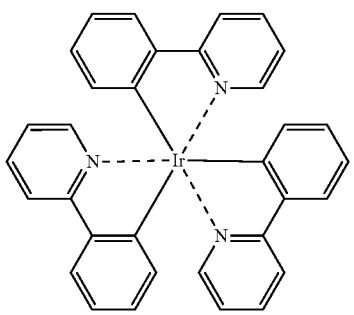

Ir(ppy)₃

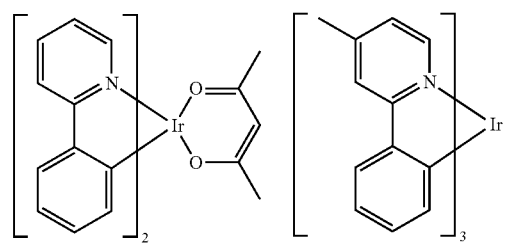

Ir(ppy)₂(acac)   Ir(mpyp)₃

Examples of known blue dopants include, but are not limited to, F2Irpic, (F₂ppy)₂Ir(tmd), Ir(dfppz)₃, ter-fluorene, DPAVBi (4,4'-bis(4-diphenylaminostyryl)biphenyl), and TBPe (2,5,8,11-tetra-t-butylperylene).

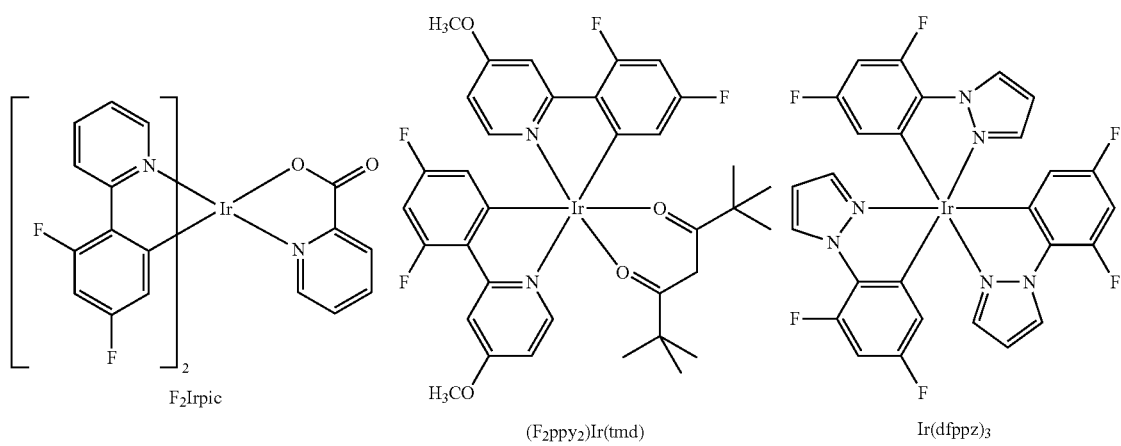

F₂Irpic   (F₂ppy₂)Ir(tmd)   Ir(dfppz)₃

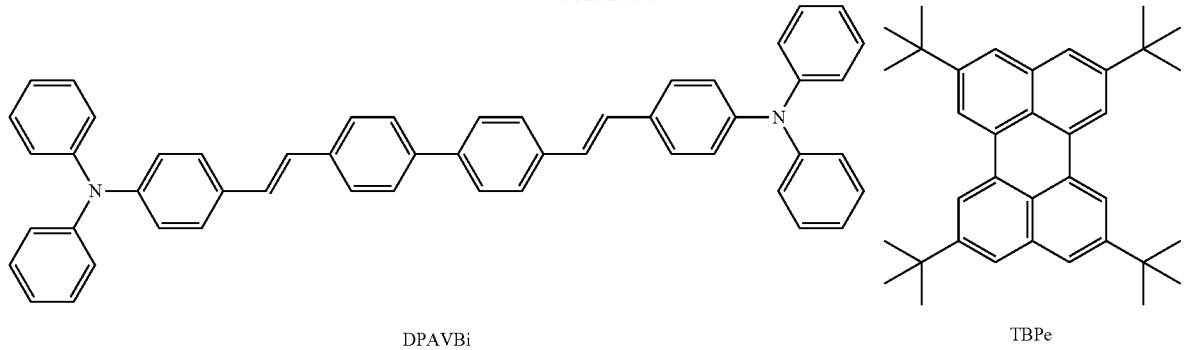

DPAVBi

TBPe

When the emission layer 125 includes both a host and a dopant, the amount of the dopant may be, but is not limited to, from about 0.01 to about 15 parts by weight based on 100 parts by weight of the host. The emission layer 125 may have a thickness of about 100 Å to about 1,000 Å.

Examples of materials for forming the electron transport layer 127 may include known electron transport materials, including Bphen (4,7-diphenyl-1,10-phenanthroline), BAlq (bis(2-methyl-8-quinolinolate)-4-(phenylphenolato)aluminum), Alq3 (tris(8-quinolate)aluminum), Bebq2 (beryllium bis(benzoquinolin-10-olate)), and TPBi (2,2',2"-(1,3,5-benzinetriyl)-tris(1-phenyl-1-H-benzimidazole)).

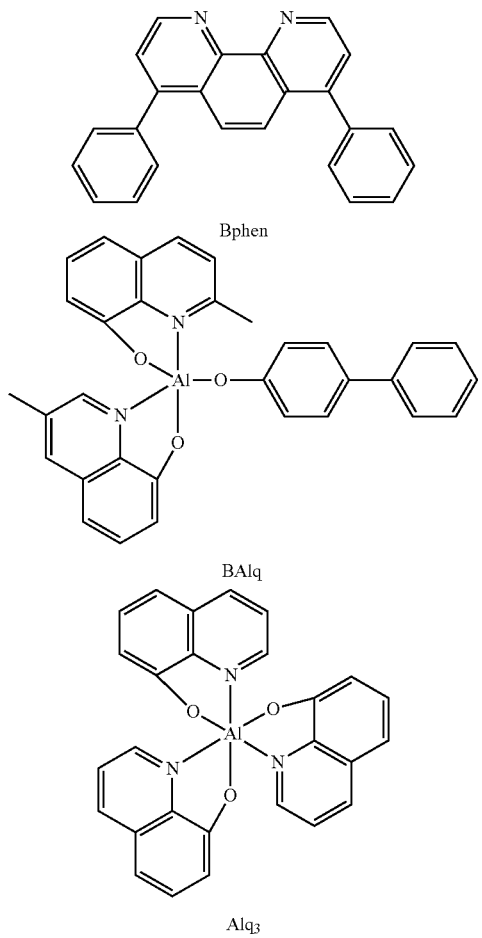

Bphen

BAlq

Alq₃

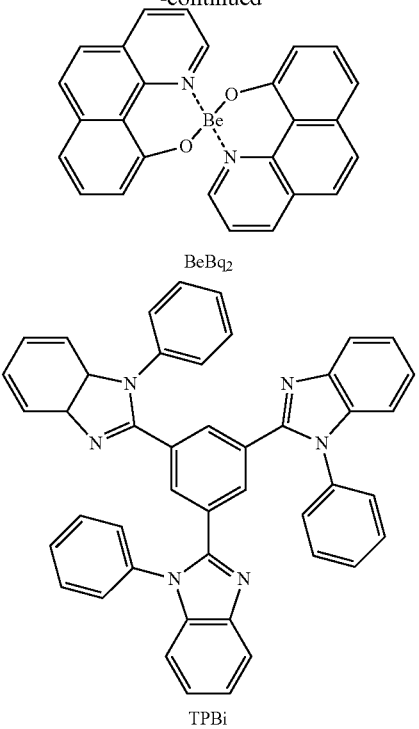

BeBq₂

TPBi

The electron transport layer 127 may have a thickness of about 100 Å to about 1,000 Å, and in some embodiments, may have a thickness of about 200 Å to about 500 Å. When the thickness of the electron transport layer 127 is within these ranges, the electron transport layer 127 may have satisfactory electron transport properties without a substantial increase in a driving voltage.

The electron injection layer 128 may be formed of, for example, LiQ, LiF, Li2O, NaCl, NaF, KF, RbF, CsF, FrF, BeF$_2$, MgF$_2$, CaF$_2$, SrF$_2$, BaO, BaF$_2$, or RaF$_2$, but materials for the electron injection layer 128 are not limited thereto.

The cathode 131 may be formed of, for example, Yb, Yb:Ag, Li, Mg, Al, Ca, Ag, Al:Li, Mg:In, or Mg:Ag, but materials for the cathode 131 are not limited thereto.

Figure 2:
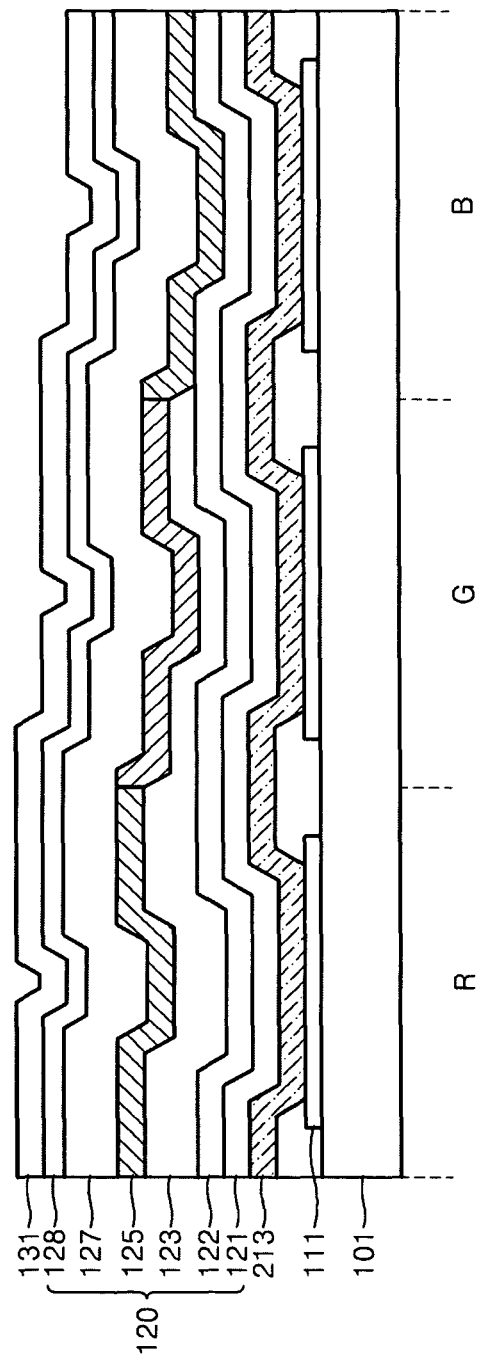
FIG. 2 illustrates a schematic cross-sectional view of an organic light-emitting device according to another embodiment.

FIG. 2 illustrates a schematic cross-sectional view of an organic light-emitting device according to another embodiment. The organic light-emitting device in FIG. 2 will be described focusing on the differences from the organic light-emitting device in FIG. 1. Except that an anode 213 may be formed of a mixture of WO$_3$ and a high-work function metal such as Ni, Au, Co or Mn, the surface of which is treated with N₂ plasma, the current embodiment may have the same structure as the embodiment of FIG. 1. The further inclusion of such a high-work function metal in the anode 213 may improve conductive characteristics.

Figure 3:
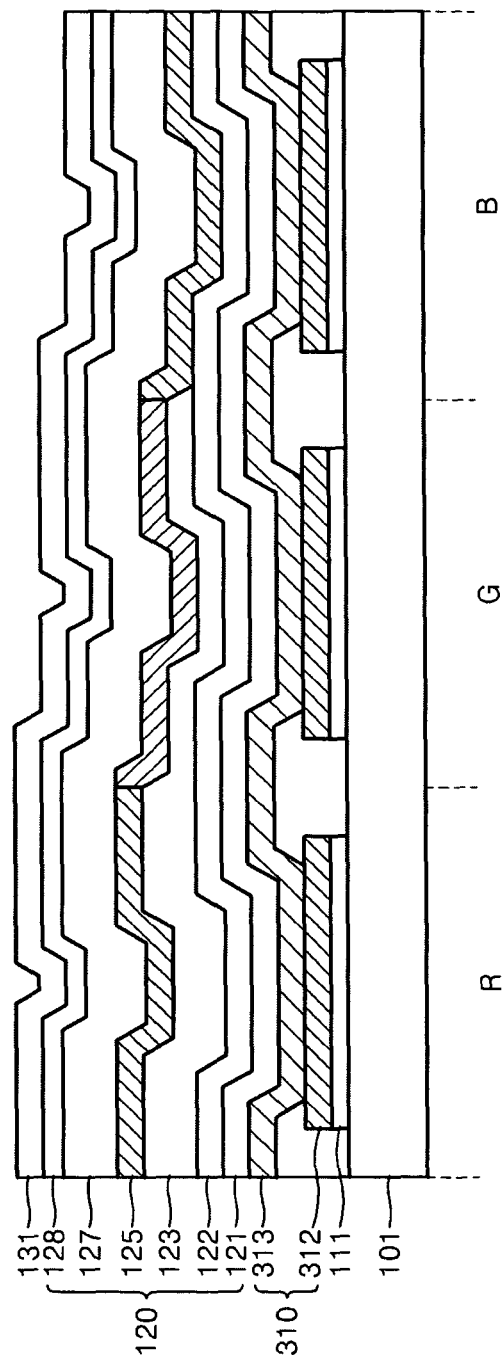
FIG. 3 illustrates a schematic cross-sectional view of an organic light-emitting device according to another embodiment.

FIG. 3 illustrates a schematic cross-sectional view of an organic light-emitting device according to another embodiment. The organic light-emitting device in FIG. 3 will be described focusing on differences from the organic light-emitting device illustrated in FIG. 1. Except that an anode 310 on the reflection layer may include a first anode layer 312 formed of a transparent conductive oxide and a second oxide layer 313 formed of WO₃ surface-treated with N₂ plasma, the current embodiment may have the same structure as the embodiment of FIG. 1. The conductive oxide for forming the first anode layer 312 may be indium thin oxide (ITO), indium zinc oxide (IZO), zinc oxide (ZnO), aluminum-doped zinc oxide (AZO), or indium oxide (In₂O₃) In another embodiment, the second anode layer 313 may be formed of a mixture of WO₃ and a high-work function metal such as Ni, Au, Co or Mn, the surface of which is treated with N₂ plasma.

The further inclusion of the conductive oxide layer (the first anode layer 312) in the anode 310 may improve hole injection characteristics. The second anode layer 313, may be formed as a single common layer for all the sub-pixels to cover the separate first anode layers 312, which are for the individual sub-pixels. The second anode layer 313 may prevent particles generated during patterning for forming the first anode layers 312, from contacting the organic layer, thereby preventing generation of dark spots.

A method of manufacturing an organic light-emitting device, according to an embodiment, will be described with reference back to FIG. 1.

First, the reflection layer 111 may be formed on the substrate 101. The substrate 101 may be any substrate that is conventionally used in organic light-emitting devices. For example, the substrate 111 may be formed of a glass substrate, a transparent plastic substrate, a silicon substrate, or a stainless substrate.

The reflection layer 111 may be formed as separate layers for the individual R, G, and B sub-pixels. The reflection layer 111 may be formed of Ag, Mg, Al, Pt, Pd, Au, Ni, Nd, Ir, Cr, Li, Ca, a combination thereof, or an alloy thereof.

The anode 113 may be formed on the reflection layer 111 as a WO₃ thin layer surface-treated with N₂ plasma. The WO₃ thin layer may be formed using, for example, thermal deposition. The WO₃ thin layer may have a thickness of about 500 Å to about 1000 Å. Subsequently, the WO₃ thin film may be exposed to N₂ plasma for the plasma treatment. The N₂ plasma treatment may define a $WO_xN_y$, ($2.2 \leq x \leq 2.6$, $0.22 \leq y \leq 0.26$) region in an upper region of the WO₃ thin layer. The anode 113 may be used in common for all the sub-pixels. In other words, the anode 113 may not be patterned into separate anodes for each sub-pixel.

The hole injection layer 121 may be formed on the anode 113. The hole injection layer 121 may be formed of, for example, a phthalocyanine compound such as copper phthalocyanine, m-MTDATA, TDATA, 2T-NATA, NPB, PEDOT/PSS, Pani/DBSA, Pani/CSA, or PANI/PSS. The hole injection layer 121 may have a thickness of about 100 Å to about 10000 Å, and in some embodiments, may have a thickness of about 100 Å to about 1000 Å.

The hole transport layer 122 may be formed on the hole injection layer 121. The hole transport layer 122 may be formed of any known hole transport material, for example, a carbazole derivative such as N-phenylcarbazole or polyvinylcarbazole, a triphenylamine-based material such as TPD, or an amine derivative having an aromatic condensed ring such as α-NPD or TCTA. The hole transport layer 122 may have a thickness of about 50 Å to about 10000 Å, and in some embodiments, may have a thickness of about 100 Å to about 800 Å.

The resonance auxiliary layer 123 may be formed on the hole transport layer 122. The resonance auxiliary layer 123 may be formed of a hole transport material, and may have a different thickness for each sub-pixel that is appropriate to induce resonance. For blue sub-pixels, the resonance auxiliary layer 123 may not be formed by adjusting the thickness of the hole transport layer 122.

The emission layer 125 may be formed on the resonance auxiliary layer 123. The emission layer 125 may be formed of a light emitting material, and in some embodiments, may be formed of a combination of a host and a dopant. Non-limiting examples of the host include Alq₃, CBP, PVK, ADN, TCTA, TPBI, TBADN, E3, and DSA. Non-limiting examples of red dopants include PtOEP, Ir(piq)₃, and Btp₂Ir(acac). Non-limiting example of green dopants include Ir(ppy)₃ (wherein "ppy" denotes phenylpyridine), Ir(ppy)₂(acac), and Ir(mpyp)₃. Non-limiting examples of blue dopants include F₂Irpic, (F₂ppy)₂Ir(tmd), Ir(dfppz)₃, ter-fluorene, 4,4'-bis(4-diphenylaminostyryl)biphenyl (DPAVBi), and 2,5,8,11-tetra-t-butyl pherylene (TBPe). When the emission layer 125 includes both a host and a dopant, the amount of the dopant may be, but is not limited to, from about 0.01 to about 15 parts by weight based on 100 parts by weight of the host. The emission layer 125 may be formed to have a thickness of about 100 Å to about 1,000 Å.

The electron transport layer 127 may be formed on the emission layer 125. The electron transport layer 127 may be formed of a known material, such as Bphen, BAlq, Alq₃, Bebq₂, or TPBi. The electron transport layer 127 may have a thickness of about 100 Å to about 1,000 Å, and in some embodiments, may have a thickness of about 200 Å to about 500 Å.

The electron injection layer 128 may be formed on the electron transport layer 127. The electron injection layer 128 may be formed of, for example, LiQ, LiF, Li2O, NaCl, NaF, KF, RbF, CsF, FrF, BeF2, MgF2, CaF2, SrF2, BaO, BaF2, or RaF2, but materials for the electron injection layer 128 are not limited thereto. The electron injection layer 128 may be formed to have a thickness of about 1 Å to about 50 Å.

The cathode 131 may be formed on the electron injection layer 128. The cathode 131 may be formed of, for example, Li, Mg, Al, Ca, Ag, Al:Li, Mg:In, or Mg:Ag, but materials for the cathode 131 are not limited thereto. The electron injection layer 128 and the cathode 131 may be formed together because they are all inorganic material.

Organic layers, such as the hole injection layer, the hole transport layer, the resonance auxiliary layer, the emission layer, or the electron transport layer may be formed using, for example, a vacuum thermal deposition method.

A method of manufacturing an organic light-emitting device according to another embodiment will be described with reference to FIG. 2. The current embodiment will be described focusing on differences from the method of manufacturing the organic light-emitting device of FIG. 1 described above. The only difference between the methods of manufacturing the organic light-emitting device of FIG. 2 and the organic light-emitting device of FIG. 1 is that the anode layer 213 of FIG. 2 is formed to further include a high-work function metal. Examples of the low-work function material include Ni, Au, Co, and Mn. The WO₃ thin layer may be formed of a mixture of WO₃ and a metal by co-deposition.

A method of manufacturing an organic light-emitting device according to another embodiment will be described with reference to FIG. 3. The current embodiment will be described focusing on differences from the method of manufacturing the organic light-emitting device of FIG. 1, described above. The method of manufacturing the organic light-emitting device of FIG. 1, according to the current embodiment may be the same as the method of manufacturing the organic light-emitting device of FIG. 1 described in the previous embodiment, except that the anode 310 may be formed to include the first anode layer 312, formed of a transparent conductive oxide, and second oxide layer 313, formed on a surface of the first anode layer 312 of $WO_3$ surface-treated with $N_2$ plasma. The first anode layer 312 may be formed of a conductive oxide, for example, ITO, IZO, ZnO, AZO, or $In_2O_3$. In another embodiment, the second anode layer 313 may be formed of a mixture of $WO_3$ and a high-work function metal such as Ni, Au, Co or Mn.

Hereinafter, electrical characteristics of a $WO_3$ thin layer surface-treated with $N_2$ plasma and an organic light-emitting device including the $WO_3$ thin layer as an anode will be described.

Figure 4:
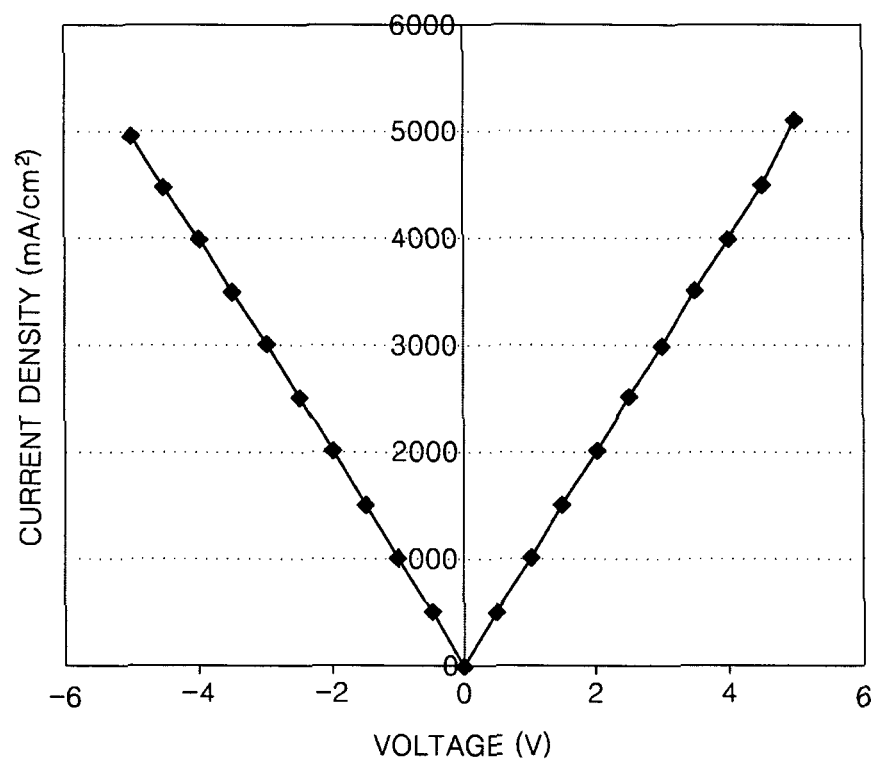
FIG. 4 illustrates a graph showing a linear current-voltage relationship in a N2 plasma-surface treated $WO_3N_y$ disposed between Mg:Ag electrodes.
Figure 5:
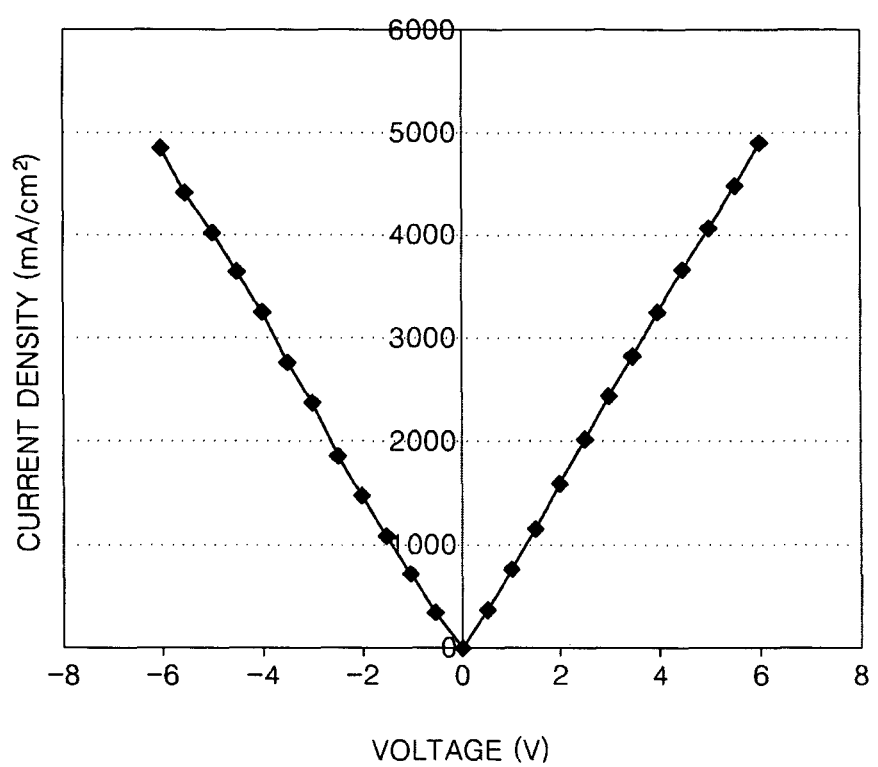
FIG. 5 illustrates a graph showing a linear current-voltage relationship in a N2 plasma-surface treated $WO_3N_y$ disposed between an ITO electrode and an Al electrode.

FIGS. 4 and 5 illustrate graphs of current density versus voltage of a $WO_3$ thin layer surface-treated with $N_2$ plasma when used in an electron transport device and in a hole transport device, respectively.

FIG. 4 illustrates a graph reflecting data obtained by measuring current density, while applying a voltage across two Mg:Ag electrodes of a simple electron transport device with a 500 Å-thick and $N_2$ plasma-treated $WO_3$ thin layer between the two electrodes. In the electron transport device used to obtain the results depicted in FIG. 4, electrons in LUMO of the $N_2$ plasma-treated $WO_3$ migrated to the Mg:Ag electrodes having a relatively low work function compared to the $N_2$ plasma-treated $WO_3$. A current flow was thereby generated, which enabled the device to operate only by the migration of electrons. The graph of FIG. 4 shows that current densities linearly respond to voltages, with the application of both a positive voltage and a negative voltage.

FIG. 5 illustrates a graph reflecting data obtained from measuring a current density, while applying a voltage across an ITO electrode and an Al electrode with a 1,500 Å-thick, $N_2$ plasma-treated $WO_3$ thin layer between the two electrodes. In the hole transport device used to obtain the results depicted in FIG. 5, holes in HOMO of the $N_2$ plasma-treated $WO_3$ migrated to the ITO electrode or Al electrode having a relatively high work function compared to the $N_2$ plasma-treated $WO_3$. A current flow was thereby generated, which enabled the device to operate only by the migration of holes. The graph of FIG. 5 shows that current densities linearly respond to voltages, with the application of both a positive voltage and a negative voltage.

Materials with non-linear current to voltage characteristics, for example, materials with diode characteristics, which are semiconductors or non-conductors, may not serve as an electrode. On the contrary, the $N_2$ plasma-treated $WO_3$, exhibiting a linear current to voltage relationship both in the electron transport device and the hole transport device, as shown in the graphs of FIGS. 4 and 5, may serve as an electrode.

The 1500 Å-thick, $N_2$ plasma-treated $WO_3$ thin layer had a resistance of about 30Ω as measured in a thickness direction of the $WO_3$ thin layer, and an area specific resistance of about 3 MΩ/□. That is, a resistance gap between the thickness and horizontal directions reaches, i.e., increases about hundred thousand times, leading to an electric conductivity gap of about hundred thousand times between the thickness and horizontal directions.

Table 1 shows work functions and dielectric constants of $WO_3$ with respect to $N_2$ flow rates during a treatment of $WO_3$ with $N_2$ plasma. Work functions were directly measured using a photon-electron spectrometer, and dielectric constant were calculated from measured electrostatic capacities. The zero $N_2$ flow rate (=0) means that no $N_2$ plasma treatment was performed. The data of Table 1 were obtained when a 1000 Å-thick $WO_3$ was not treated with $N_2$ plasma ($N_2$ flow rate=0) and when treated at a $N_2$ flow rate of 10 sccm and 50 sccm.

TABLE 1

| $N_2$ flow rate (sccm) | Work function (eV) | Dielectric constant |
|---|---|---|
| 0 | 5.35 | 5.1 |
| 10 | 5.55 | 6.9 |
| 50 | 5.60 | X |

Referring to Table 1, the work function and dielectric constant become greater with the $N_2$ plasma treatment, as compared to the case without $N_2$ plasma treatment, and with the higher $N_2$ flow rate in the $N_2$ plasma treatment.

The dielectric constants obtained when a $N_2$ plasma treatment was not conducted and at a $N_2$ flow rate of 10 sccm were 5.1 and 6.9, respectively, indicating that the $WO_3$ thin layer had non-conductor properties. The dielectric constant at a $N_2$ flow rate of 50 sccm was infinite, indicating that the $WO_3$ thin layer exhibited conductor properties. The conductor properties attained by the $N_2$ plasma treatment may be attributed to a change in interior oxygen content. The higher the $N_2$ flow rate was, the higher the work function became, which is attributed to surface energy changes with increasing $N_2$ amount.

Table 2 shows composition data of $WO_3$ with respect to $N_2$ flow rate during $N_2$ plasma treatment on $WO_3$. Table 2 shows a composition analysis result of a 50 Å-thick, $N_2$ plasma-treated $WO_3$. The composition analysis was conducted using atomic emission spectroscopy (AES).

TABLE 2

| | Composition ratio | | | |
|---|---|---|---|---|
| $N_2$ flow rate (sccm) | W | O | N | W:O:N |
| 0 | 22.36 | 74.42 | 3.23 | 1:3.33:0.14 |
| 10 | 23.85 | 71.18 | 4.98 | 1:2.98:0.21 |
| 50 | 27.34 | 66.09 | 6.56 | 1:2.42:0.24 |

Referring to Table 2, the higher the $N_2$ flow rate in plasma treatment, the higher the composition ratios of tungsten (W) and nitrogen (N) in the $WO_3$ thin layer and the lower the composition ratio of oxygen (O). Conductive properties are found to be improved with increased composition ratios of tungsten (W) and nitrogen (N).

Example 1

A 800 Å-thick, $N_2$ plasma-treated $WO_3$ thin layer anode, a 500 Å-thick hole transport layer, a 200 Å-thick emission layer, a 300 Å-thick electron transport layer, a 10 Å-thick electron injection layer, and a 120 Å-thick cathode were sequentially formed on a substrate to manufacture a blue organic light-emitting device. A hole injection layer material was DNTPD (N,N'-diphenyl-N,N'-bis-[4-(phenyl-m-tolyl-amino)-phenyl]-biphenyl-4,4'-diamine), a hole transport layer material was NPB (N,N'-di(1-naphthyl)-N,N'-diphenylbenzidine), and an emission layer material was a ADN (9,10-di(naphthalene-2-yl)anthracene) host and a DPAVBi (4,4'-bis[2-(4-(N,N-diphenylamino)phenyl)vinyl]biphenyl) dopant, an electron transport layer material was Bebq$_2$, and an electron injection layer material was LIF. A 120 Å-thick Mg:Ag stack was used as the cathode.

Comparative Example 1

A 1000 Å-thick ITO anode, a 1300 Å-thick hole transport layer, a 200 Å-thick emission layer, a 300 Å-thick electron transport layer, and a 130 Å-thick cathode were sequentially formed on a substrate to manufacture a blue organic light-emitting device. The same materials as used in Example 1 were used for the hole transport layer, the emission layer, the electron transport layer, the electron injection layer, and the cathode.

Comparative Example 2

An organic light-emitting device was manufactured in the same manner as in Example 1, except that pure WO$_3$ was used for the anode without N$_2$ plasma treatment.

J-V Characteristics Measurement

Figure 6:
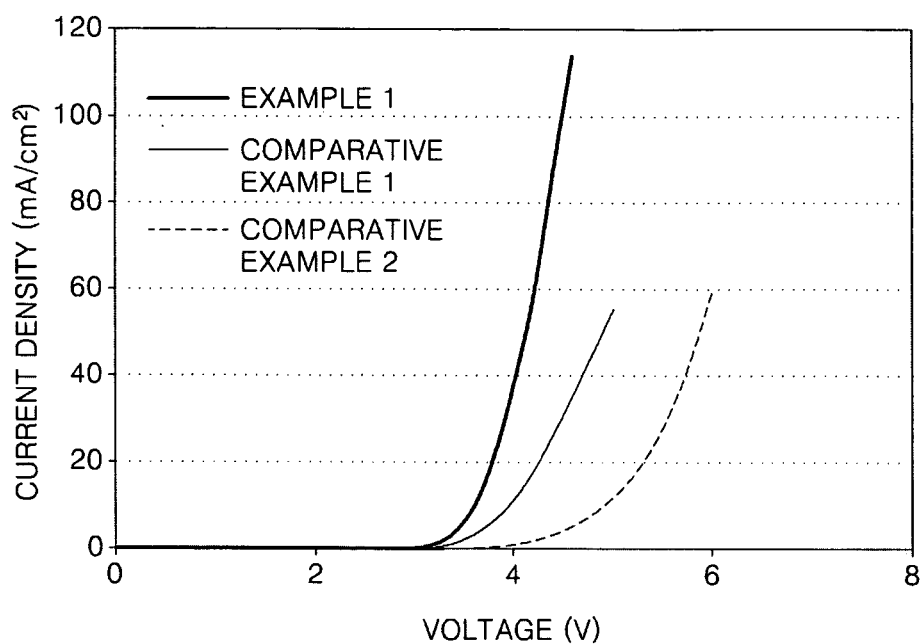
FIG. 6 illustrates a graph comparing the current versus voltage characteristics of organic light-emitting devices of Example 1 and Comparative Examples 1 and 2.
Figure 7:
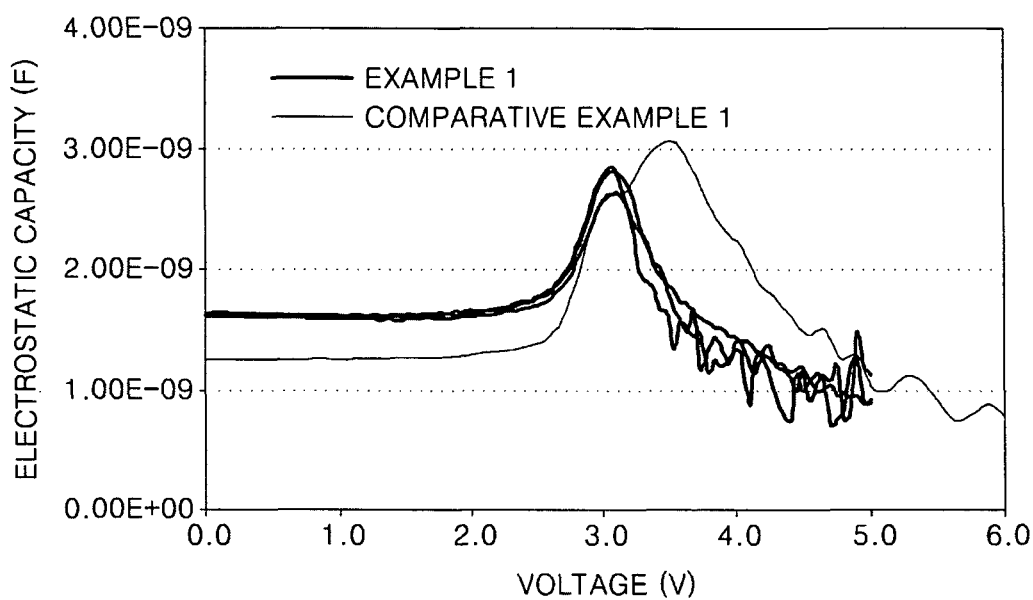
FIG. 7 illustrates a graph comparing the electrostatic capacity versus voltage characteristics of the organic light-emitting devices of Example 1 and Comparative Example 1.

FIG. 6 illustrates a graph comparing the current density versus voltage characteristics of the organic light-emitting devices of Example 1 and Comparative Examples 1 and 2. Referring to FIG. 7, the organic light-emitting device of Example 1 using N$_2$ plasma-treated WO$_3$ as an anode is found to have a driving voltage lower than that of the organic light-emitting device of Comparative Example 1 by about 0.8V at a current density of 20 mA/cm$^2$. The organic light-emitting device of Comparative Example 2, using no N$_2$ plasma-treated WO$_3$ as an anode, is found to have a driving voltage higher by about 0.4V than that of the organic light-emitting device of Comparative Example 2 at a current density of 20 mA/cm$^2$. These results indicate that use of N$_2$ plasma-treated WO$_3$ as an anode may enable manufacturing of an organic light-emitting device having a low driving voltage.

FIG. 7 illustrates a graph for comparing the electrostatic capacity versus voltage relationship between the organic light-emitting devices of Example 1 and Comparative Example 1. A total thickness of the organic layers in Example 1, which was about 1000 Å, including the 500 Å-thick hole transport layer, the 200 Å-thick emission layer, and the 300 Å-thick electron transport layer, was about 45% less relative to that of the organic layers in Comparative Example 1 that was about 1800 Å including the 1300 Å-thick hole transport layer, the 200 Å-thick emission layer, and the 300 Å-thick electron transport layer. On the contrary, referring to FIG. 7, the organic light-emitting device of Example 1 is found to have an electrostatic capacity of about 1.6 nF at an initial voltage of 2V or less, which is about 33% higher as compared to the organic light-emitting device of Comparative Example 1, having an electrostatic capacity of about 1.2 nF. The electrostatic capacity of Example 1 appears not to be in truly inverse proportion to the thickness of the dielectric layers, which is believed to be because the N$_2$ plasma-treated WO$_3$ electrode of Example 1 works as a pseudo electrode rather than as a true electrode. Physical values of true electrodes such as resistance, conductivity, mobility, electrostatic capacity and the like vary, completely proportional to a thickness change of the organic layer, independently from the electrode thickness, while those of pseudo electrodes are proportional, but not completely proportional, to a thickness change of the organic layer.

Figure 8:
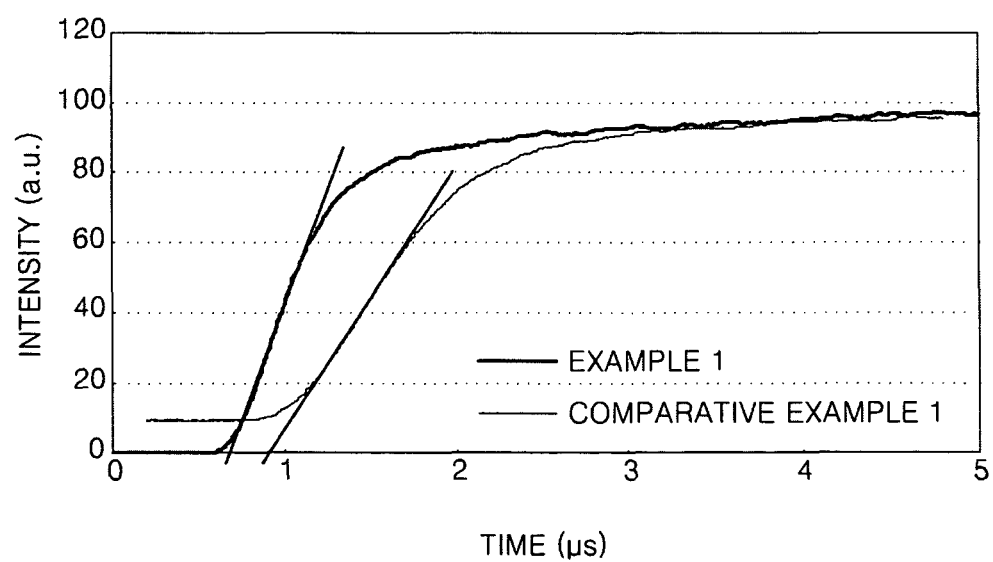
FIG. 8 illustrates a graph showing electroluminescence with respect to time of the organic light-emitting devices of Example 1 and Comparative Example 1.

FIG. 8 illustrates a graph of transient electroluminescence with respect to time of the organic light-emitting devices of Example 1 and Comparative Example 1. Charge mobilities of Example 1 and Comparative Example 1 calculated from plot slopes in FIG. 1 were about 2.3×10$^{-4}$ cm2/(V·s) and about 1.7×10$^{-4}$ cm$^2$/(V·s), respectively, indicating about 35% higher in Example 1 than in Comparative Example 1. Only 35% higher charge mobility with about 45% less thickness of the organic electrode in Example 1 relative to Comparative Example 1 is believed to be because the electrode of Example 1 works as a pseudo electrode, not as a true one.

The thickness of the anode layer may be increased for optical distance adjustment by the N$_2$ plasma treatment of the WO$_3$ thin layer forming the anode layer, without a driving voltage increase. The N$_2$ plasma-treated WO$_3$ thin layer, which is a common layer for all sub-pixels, may exhibit high conductivity in a vertical direction, but low conductivity in a horizontal direction. Thus, the N$_2$ plasma-treated WO$_3$ thin layer may transfer a voltage from separate reflection layers to organic layers without interference between adjacent sub-pixels.

Embodiments may provide an organic light-emitting device including a transparent electrode having high conductivity in a vertical direction but low conductivity in a horizontal direction, and a method of manufacturing the organic light-emitting device.

While embodiments have been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An organic light-emitting device, comprising:
    a substrate;
    an anode layer on the substrate, the anode layer including a lower region including WO$_3$ and an upper region including WO$_x$N$_y$ (2.2≤x≤2.6 and 0.22≤y≤0.26), the lower region being closer to the substrate than the upper region;
    an emission structure layer on the anode layer such that anode layer is between the emission structure layer and the substrate; and
    a cathode layer on the emission structure layer.

2. The organic light-emitting device as claimed in claim 1, wherein the upper region of the anode layer has a thickness of about 50 Å to about 100 Å.

3. The organic light-emitting device as claimed in claim 1, wherein the anode layer has a thickness of about 500 Å to about 1,000 Å.

4. The organic light-emitting device as claimed in claim 1, wherein the anode layer further includes a metal selected from silver (Ag), aluminum (Al), molybdenum (Mo), nickel (Ni), cobalt (Co), manganese (Mn), and indium (In).

5. The organic light-emitting device as claimed in claim 1, wherein the emission structure layer includes a hole transport layer, an emission layer, and an electron transport layer, sequentially, on the anode layer.

6. The organic light-emitting device as claimed in claim 5, wherein the emission structure layer further includes a hole injection layer on the anode layer, and an electron injection layer on the electron transport layer.

7. The organic light-emitting device as claimed in claim 5, wherein the emission structure layer further includes a resonance auxiliary layer between the hole transport layer and the emission layer.

8. An organic light-emitting device comprising:
a substrate;
an anode layer on the substrate, the anode layer including a lower region including $WO_3$ and an upper region including $WO_xN_y$ ($2.2 \leq x \leq 2.6$ and $0.22 \leq y \leq 0.26$), the lower region being closer to the substrate than the upper region;
an emission structure layer on the anode layer such that the anode layer is between the emission structure layer and the substrate; and
a cathode layer on the emission structure layer,
wherein the emission structure layer includes a red region, a green region, and a blue region, and the lower region and the upper region of the anode layer are common layers for the red region, the green region, and the blue region.

9. The organic light-emitting device as claimed in claim 8, further including a reflection layer between the substrate and the anode layer.

10. A method of manufacturing an organic light-emitting device, the method comprising:
preparing a substrate;
forming a $WO_3$ thin layer on the substrate;
performing an $N_2$ plasma treatment on the $WO_3$ thin layer to form an anode layer including a lower region including $WO_3$ and an upper region including $WO_xN_y$ ($2.2 \leq x \leq 2.6$ and $0.22 \leq y \leq 0.26$), the lower region being closer to the substrate than the upper region;
forming an emission structure layer on the anode layer such that the anode layer is between the emission structure layer and the substrate; and
forming a cathode layer on the emission structure layer.

11. The method as claimed in claim 10, wherein the upper region of the anode layer has a thickness of about 50 Å to about 100 Å.

12. The method as claimed in claim 10, wherein the anode layer has a thickness of about 500 Å to about 1,000 Å.

13. The method as claimed in claim 10, wherein forming the $WO_3$ thin layer includes further incorporating a metal into the $WO_3$ thin layer, the metal being selected from silver (Ag), aluminum (Al), molybdenum (Mo), nickel (Ni), cobalt (Co), manganese (Mn), and indium (In).

14. The method as claimed in claim 10, wherein forming the emission structure layer includes sequentially forming a hole transport layer, an emission layer, and an electron transport layer on the anode layer.

15. The method as claimed in claim 14, further including forming a resonance auxiliary layer between the hole transport layer and the emission layer.

16. The method as claimed in claim 14, wherein the forming of the emission structure layer further includes forming a hole injection layer on the anode layer, and forming an electron injection layer on the electron transport layer.

17. The method as claimed in claim 10, wherein the emission structure layer includes a red region, a green region, and a blue region, and the anode layer is common for the red region, the green region, and the blue region.

18. The method as claimed in claim 17, further includes forming a reflection layer between the substrate and the anode layer.

* * * * *